United States Patent
Huang

(10) Patent No.: US 9,054,730 B2
(45) Date of Patent: Jun. 9, 2015

(54) METHOD AND SYSTEM FOR LZW BASED DECOMPRESSION

(71) Applicant: Compart AG, Böblingen (DE)

(72) Inventor: Jing Huang, Böblingen (DE)

(73) Assignee: COMPART AG, Boblingen (DE)

(*) Notice: Subject to any disclaimer, the term of this patent is extended or adjusted under 35 U.S.C. 154(b) by 0 days.

(21) Appl. No.: 14/474,680

(22) Filed: Sep. 2, 2014

(65) Prior Publication Data

US 2015/0130646 A1  May 14, 2015

(30) Foreign Application Priority Data

Sep. 3, 2013  (EP) .................................... 13182801

(51) Int. Cl.
*H03M 7/40* (2006.01)
*H03M 7/30* (2006.01)

(52) U.S. Cl.
CPC .......... *H03M 7/3095* (2013.01); *H03M 7/3088* (2013.01)

(58) Field of Classification Search
CPC ............ H03M 7/3084; H03M 7/3086; H03M 7/3088; H03M 7/3091; H03M 7/3095
USPC ................................ 341/51, 67, 87
See application file for complete search history.

(56) References Cited

U.S. PATENT DOCUMENTS

| | | | | |
|---|---|---|---|---|
| 5,642,112 A * | 6/1997 | Cooper | ............................ | 341/51 |
| 6,624,762 B1 * | 9/2003 | End, III | ............................ | 341/51 |
| 7,071,854 B1 * | 7/2006 | Cardosa et al. | ................. | 341/67 |
| 7,696,906 B2 * | 4/2010 | Dey | ............................... | 341/51 |

OTHER PUBLICATIONS

Welch T A: "A Technique for High-Performance Data Compression", Computer, IEEE, US, Jun. 1, 1984, pp. 8-19, XP000743063, ISSN: 0018-9162, DOI: 10.1109/MC. 1984.1659158.

* cited by examiner

*Primary Examiner* — Khai M Nguyen

(74) *Attorney, Agent, or Firm* — Shlesinger, Arkwright & Garvey LLP

(57) ABSTRACT

A computer implemented method, computer program product, and system for decompressing compressed data. The system (400) has an interface component (420) configured to access and read a compressed data set (310) encoded with a LZW based compression algorithm. The compressed data set (310) includes a sequence of elements including byte characters (B) and symbols (S1/S2), each symbol corresponding to an encoded subset of the data set, and each symbol having a first portion (S1) including a previous symbol or a byte character and having a second portion (S2) including a byte character. The system further has a decoder (410) configured to generate a decompressed data set (320) by applying a LZW based decompression algorithm to the compressed data set (310) The decoder (410) makes use of a reverse order stack (440) configured for intermediate storage of byte characters decoded by the decoder (410) from the compressed data set (310). In one embodiment the system further has a dictionary which can store the full content values of symbols.

11 Claims, 4 Drawing Sheets

METHOD AND SYSTEM FOR LZW BASED DECOMPRESSION

RELATED APPLICATIONS

This is a nonprovisional application claiming the priority benefit of EP 13 182 801.4, filed on Sep. 3, 2013, which is hereby incorporated by reference.

TECHNICAL FIELD

The present invention generally relates to electronic data processing, and more particularly, relates to methods, computer program products and systems for decompression of data.

BACKGROUND

LZW based compression and decompression algorithms are known in the art for encoding/decoding sequences of 8-bit data (bytes) to codes, where each code represents one or more bytes, respectively. The original LZW (Lempel-Ziv-Welch) algorithm is a lossless data compression and decompression algorithm that is often used to compress images. Extensions of the original LZW algorithm are, for example, LZ77 and LZ78 and other variants of the LZW algorithm are known as LZMW, LZAP and LZWL variants.

During the compression phase a symbol dictionary is created dynamically. The dictionary is not stored with the compressed data set but can be dynamically recreated during the decompression phase.

During the compression phase LZW based algorithms compress sequences of byte characters into encoded data, which will be referred to as symbols hereinafter. A symbol in the encoded data may have a fixed length of 9 to 16 bits, or a variable length increasing from 9 to 16 bits during compression and decompression.

Decompression in the context of this specification means, that sequences of codes including byte characters and symbols are translated back into the original raw data (uncompressed data set). In LZW based algorithms byte characters with a value less than 256 represent raw data directly. Symbols having the values 256 and 257 typically have a special internal meaning (clear, end). Symbols having values larger than 257 include two parts: a first portion which can include a previously defined symbol or a byte character, and a second portion including a byte character, which is the first byte of the next symbol in sequence. A previously defined symbol is already available in the dictionary.

The general method of the LZW based decompression algorithms is using a push-down stack which is also referred to as a last-in-first-out (LIFO) stack. A LIFO stack is a block of memory which is organized in a way that the last data stored in the stack will be output from the stack first. For resolving symbols into the respective uncompressed byte characters (raw data) during the decompression phase, symbols are at least partially pushed into the stack and combined with the existing stack values. Due to the above described usage of the stack the decoded values are retrieved from the stack in the reversed order and are then transformed by a respective software component into the correct order for finally outputting the correct decompressed data set. LZW based decoders, such as currently implemented in LINUX or in FREETYPE libraries (cf., www.freetype.org), use the above push-down stack approach. However, this transformation is time consuming and disadvantageous with regards to the computational efficiency of LZW based decompression systems.

SUMMARY

Therefore, there is a need to improve the computational efficiency of computer systems for LZW based data decompression. This technical problem is solved by the technical features of a computer system, a computer implemented method and a computer program product as specified by the independent claims.

In one embodiment, a computer system for LZW based data decompression includes an interface component which is configured to access and read a compressed data set encoded with a LZW based compression algorithm. The compressed data set may have been created by an LZW based encoder which can be part of the decoding computer system or of another computer system which may be separate from the decoding computer system. The interface can be any standard interface known in the art to access data also on remote data storage.

The compressed data set includes a sequence of elements including byte characters and symbols. Each symbol corresponds to an encoded subset of the data set. Each symbol has a first portion which may include a previous symbol or a byte character (raw data), and further has a second portion including a byte character (raw data).

The computer system further includes a decoder which is configured to generate a decompressed data set by applying a LZW based decompression algorithm to the compressed data set. Thereby, the decoder can use a reverse order stack for the decoding or the resolution of symbols in the compressed data set. The reverse order stack of the computer system can intermediately store byte characters decoded from the compressed data set by the decoder. A reverse order stack in the context of this specification is a LIFO stack which is filled in reverse order starting at the last memory address of the stack.

The technical effect of using a reverse order stack is that the decoded byte characters are output by the reverse order stack already in the correct order for recreating the uncompressed original raw data. This eliminates the need for the additional data transformation as performed by the prior art solutions and increases the computational efficiency in cases where symbols are part of the compressed data set. Typically, the above advantages can be achieved when applying the claimed decompression method to LZW based compressed data sets having a format like for example, Printable Document Format (PDF), UNIX file format, Graphics Interchange Format (GIF), or Tagged Image File Format (TIF). Further formats may be considered as possible targets for the described data decompression method by a person skilled in the art.

In a further embodiment, a computer implemented method specifies the algorithm, which is executed by the decoding computer system for achieving the above advantage. In more detail, the method can include the following steps for resolving symbols with the reverse order stack. Thereby, the generating of a decompressed data set by applying a LZW based decompression algorithm to the compressed data set is modified for effectively using the reverse order stack. For resolving a decoded symbol the method includes setting a stack pointer to the reverse order stack address pointing to the end of the reverse order stack. As a consequence, the first entry written into the reverse order stack is always at the end of the memory block. After all entries are written to the reverse order stack the full content of the stack (all entries) can be output at once wherein all entries are already in the correct order.

The applied algorithm then loops over all elements of the compressed data set. For each element of the compressed data set the following checks and actions are performed for symbol resolution.

If the current element is a symbol, writing the second portion of the symbol to the current reverse order stack address, and decreasing the stack pointer. Decreasing the stack pointer has the effect that the next stack entry will be stored "before" the first entry in the reverse order stack (i.e., at the address preceding the current address). The effect is that the first and second entries will be output in the correct order when the whole reverse order stack content is output at once.

If the first portion of the symbol is a byte character, writing the first portion to the current reverse order stack address and outputting the reverse order stack content. The output corresponds to the fully resolved symbol in the right order of byte characters. The algorithm can now proceed with the next element of the compressed data set and resets the stack pointer to the end of the stack, thus being ready to resolve the next symbol.

If the first portion of the symbol is a further symbol, a recursive process for resolving the symbol is used. The further symbol is treated in the same way as the symbol itself. In other words, the above described checks and activities which were applied to the symbol are now applied to the further symbol. This is recursively repeated until the first portion of the further symbol is a byte character. In this recursive context "further symbol" needs to be understood as the symbol which is currently processed by the algorithm. When the recursive symbol resolution finally arrives at a (further) symbol which has a byte character as the first portion, the original symbol has been fully resolved and the first portion of this last further symbol is written to the current reverse order stack address. Now the current (symbol) element of the loop has been completely resolved and the result is in the reverse order stack whose content can now be output. The algorithm can then proceed with the next element of the compressed data set and resets the stack pointer to the end of the stack, thus being ready to resolve the next symbol.

In a further embodiment, the computer implemented method further improves the performance of the decoding computer system. Typically LZW based decompression algorithms use a dictionary for storing the symbol entries which are dynamically created during the decoding phase. The symbols are stored as described above with respective first and second portions.

The dictionary may be expanded to further store a representation of the full (content) value of a symbol (i.e., the full byte sequence corresponding to the resolved symbol) as a sequence of byte characters or by using a combination of a full value pointer to the respective address in the decompressed data set and the number of bytes of the decoded symbol. In this case the recursive resolution of a symbol whose first portion is a further symbol can be shortened. After the second portion of the symbol has been written to the reverse order stack and the respective decreasing of the stack pointer, the decoder can retrieve the full value (full byte sequence) of the further symbol through the dictionary and write it to the reverse order stack after having decreased the stack pointer by the number of bytes which corresponds to the length of the full value of the further symbol. Thereby the system ensures that the full value is written to the correct reverse order stack address and the output of reverse order stack content is the correct order of byte characters which were encoded by the symbol. In case of multiple nested symbols this embodiment can lead to significant performance gains because the multiple recursive steps can be reduced to one step using the full value of the further symbol.

In a still further embodiment, a computer program product when loaded into a memory of the decoding computer system and executed by at least one processor of the computer system causes the computer system to execute the steps of the above computer implemented method.

Further aspects of the invention will be realized and attained by means of the elements and combinations particularly depicted in the appended claims. It is to be understood that both, the foregoing general description and the following detailed description are exemplary and explanatory only and are not restrictive of the invention as described.

DETAILED DESCRIPTION

Figure 1:
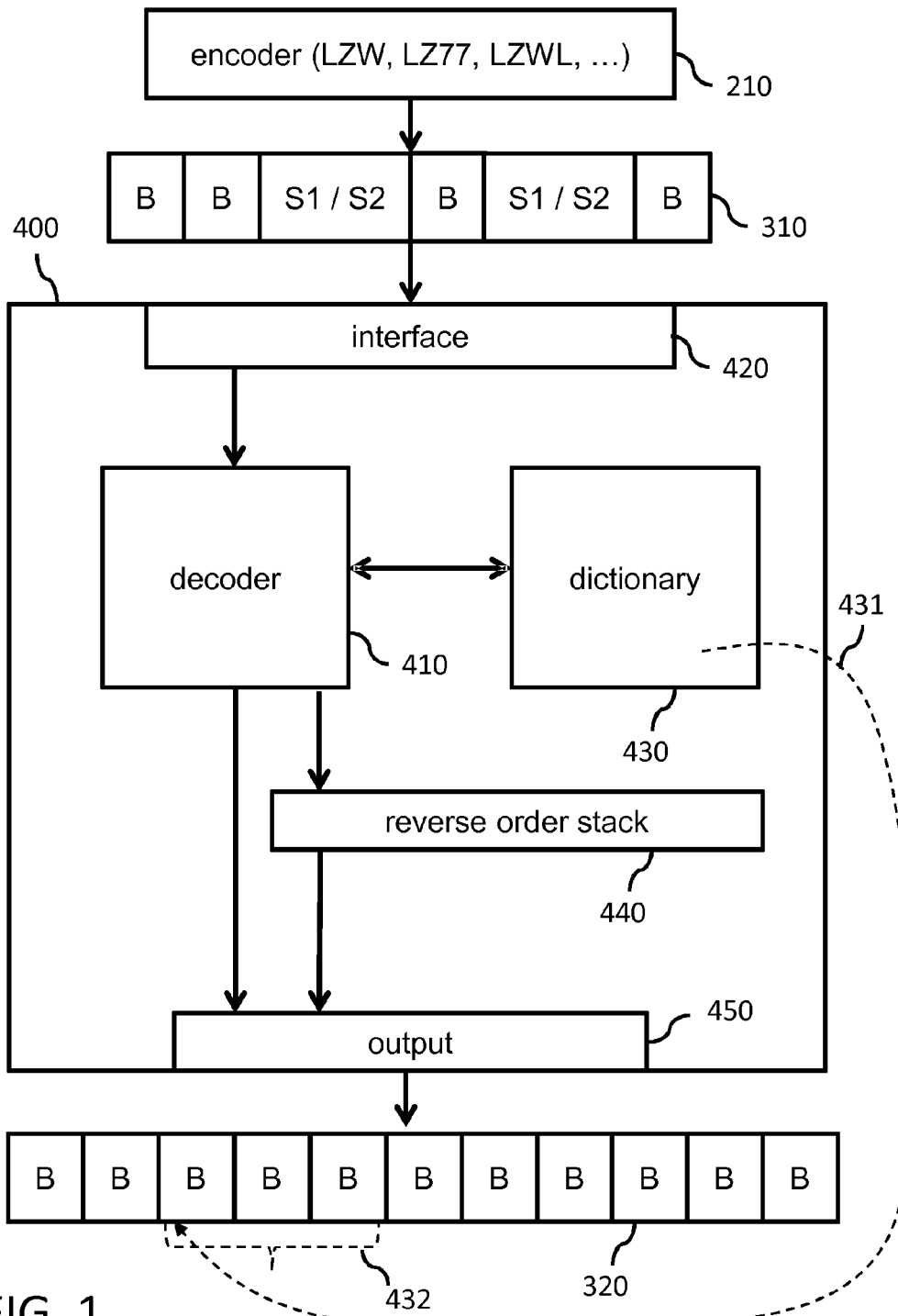
FIG. 1 is a simplified block diagram of a decompression computer system according to an embodiment of the invention.

FIG. 1 is a simplified block diagram of a decompression computer system 400 according to an embodiment of the invention. The input to the computer system 400 is a compressed data set 310, which may have been created previously by a LZW based encoder 210. It is not important in the context of the invention, when and where the compressed data set 310 was generated and which variant or extension of the LZW algorithm was used by the encoder 210. Table 1 shows an example of a classic LZW encoding algorithm. As this is well known in the prior art it will not discussed in detail. The algorithm is applied to a byte character sequence "L Z W L Z 7 8 L Z 7 7 L Z" (blanks are only used as separators between the byte characters for better readability). The algorithm loops over the sequence and generates symbols (e.g., 102h to 109h) in a dictionary when respective character patterns are repeated in the sequence. Those symbols are finally replacing the sequence of byte characters in the output which leads to the data compression. As can be seen from the example, symbols can be nested. For example, symbol 105h includes (is composed by) symbol 102h and the byte character "7". The symbols in the example are written in hex numbers. For example symbol 102h (or 0001,0000,0010b) equals the decimal value 258. Any other appropriate representation of a symbol may be used. In general, symbols 100h and 101h have been assigned the special meanings CLEAR and END. CLEAR can be used at the beginning of output, and every time when a symbols count reaches a predefined limitation. END indicates the end of the input sequence of characters.

TABLE 1

LZW compression

| Char Input | last element | new key | found | dictionary symbol | content value | output |
|---|---|---|---|---|---|---|
| L |   | L |   | empty |   |   |
| Z | L | Z |   | 102h | LZ | L |
| W | Z | W |   | 103h | ZW | Z |
| L | W | L |   | 104h | WL | W |
| Z | L | Z | 102h |   |   |   |
| 7 | 102h | 7 |   | 105h | 102h + 7 | 102h |
| 8 | 7 | 8 |   | 106h | 78 | 7 |
| L | 8 | L |   | 107h | 8L | 8 |
| Z | L | Z | 102h |   |   |   |
| 7 | 102h | 7 | 105h |   |   |   |
| 7 | 105h | 7 |   | 108h | 105h + 7 | 105h |
| L | 7 | L |   | 109h | 7L | 7 |
| Z | L | Z | 102h |   |   | 102h |
| END |   |   |   |   |   | END |

The resulting compressed data set 310 is "L Z W 102h 7 8 105h 7 102h"

The computer system 400 for decompressing the compressed data has an interface component 420 for access and reading the compressed data set 310. The computer system may use a portion of its memory to buffer the compressed data set 310 for further processing.

The compressed data set 310 (encoded with a LZW based compression algorithm) includes a sequence of elements including byte characters illustrated by B segments and symbols illustrated by the larger S1/S2 segments.

Figure 3:
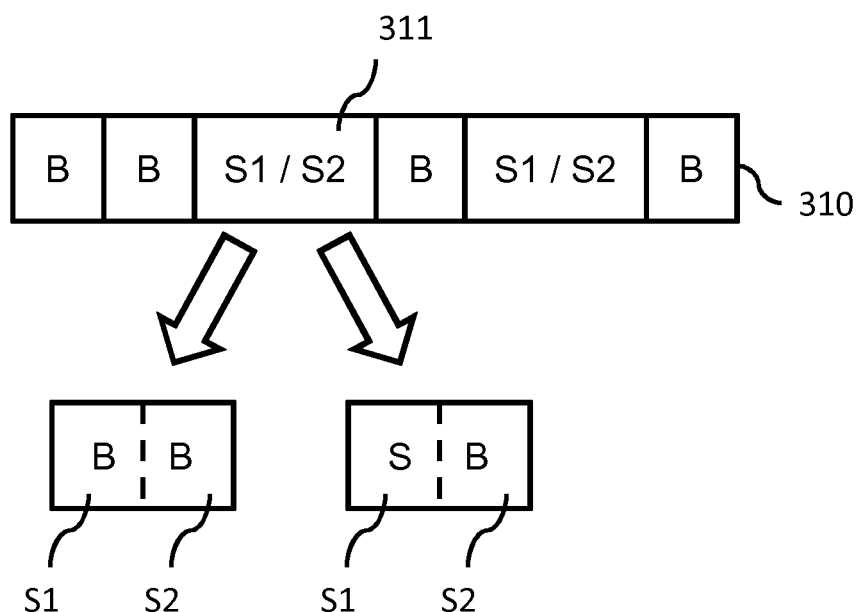
FIG. 3 illustrates a LZW based compressed data set including a sequence of byte characters and encoded symbols.

Turning briefly to FIG. 3, each symbol 311 corresponds to an encoded subset of the data set, and each symbol 311 has a first portion S1 which can include a previous symbol or a byte character and further has a second portion S2 which includes a byte character. That is, there are basically different types of symbols. One type, as illustrated by the left arrow, includes two byte characters (raw data). The other type, as illustrated by the right arrow, includes a further symbol in the S1 portion, which can be seen as a kind of pointer to further byte characters (raw data) and includes a byte character in the S2 portion.

Turning back to FIG. 1, the system further has a decoder 410 which is configured to generate a decompressed data set 320 by applying a LZW based decompression algorithm to the compressed data set 310. The decoder is communicatively coupled with a dictionary. The dictionary can be an integrated component of the computer system 400 but it may also be remotely stored on a separate device which can be accessed by the computer system 400. The dictionary is used to store the symbol entries which are dynamically created during the decompression phase. In the context of the embodiment described later under FIG. 5 the dictionary is extended to further store the full value of a symbol.

The system 400 further includes a reverse order stack 440 for intermediate storage of byte characters decoded by the decoder 410 from the compressed data set 310. The reverse order stack 440 allows speeding up the resolution/decoding of symbols in the compressed data set 310 because the additional transformation of the stack content at the end of symbol resolution is eliminated.

Figure 6:
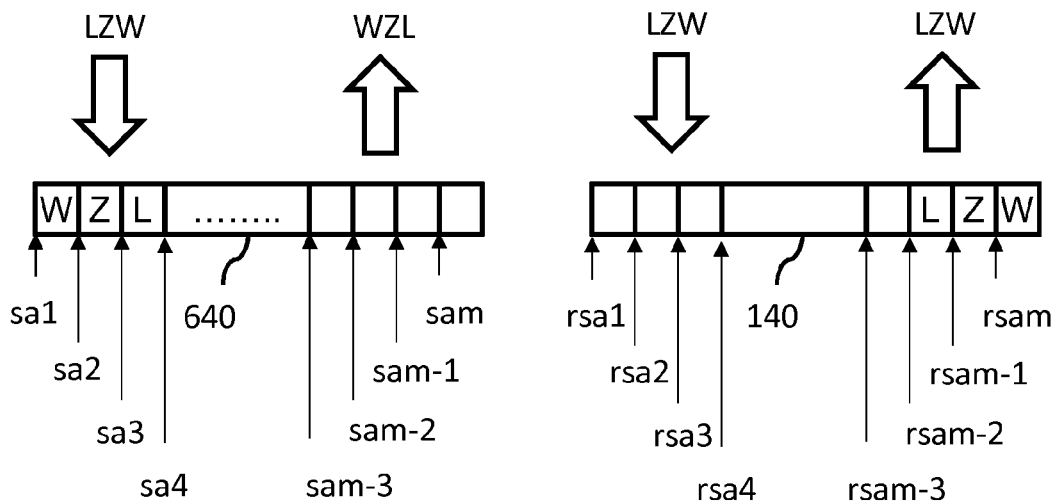
FIG. 6 illustrates the difference between a standard LIFO stack and the reverse order stack according to an embodiment of the invention.

Turning briefly to FIG. 6, the left part of the drawing illustrates the prior art push-down stack approach resulting in an reversed output, whereas the right part illustrates the approach according to an embodiment of the invention where a reverse order stack immediately provides the correct output.

Coming back to FIG. 1, the decoder 410 sends byte characters which are included in the compressed data set directly to the output 450. Symbols are first resolved by using the reverse order stack and then sent to the output. The reverse order stack content may be sent directly to the output once a symbol has been fully resolved/decoded or it may sent through the decoder 410 to the output. At the end, when all elements of the compressed data structure have been processed accordingly by the decoder 410, the complete decompressed data structure 320 was sent to the output.

Figure 2:
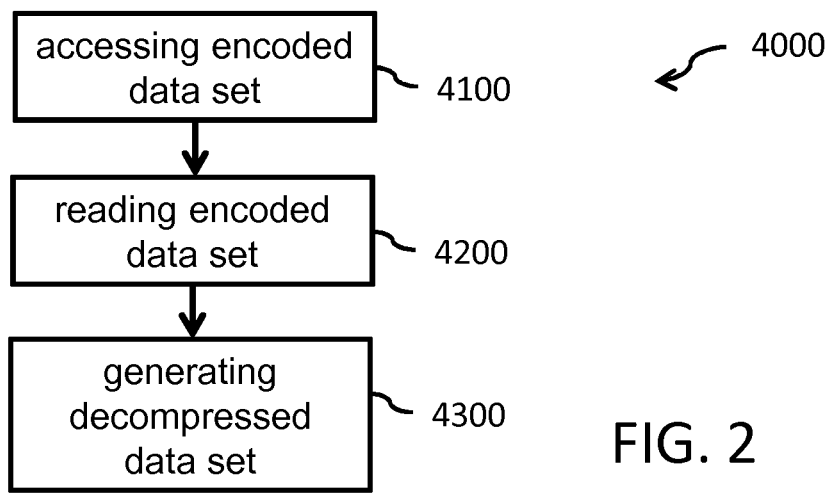
FIG. 2 is a high level flow chart of a computer implemented method according to an embodiment of the invention.
Figure 4:
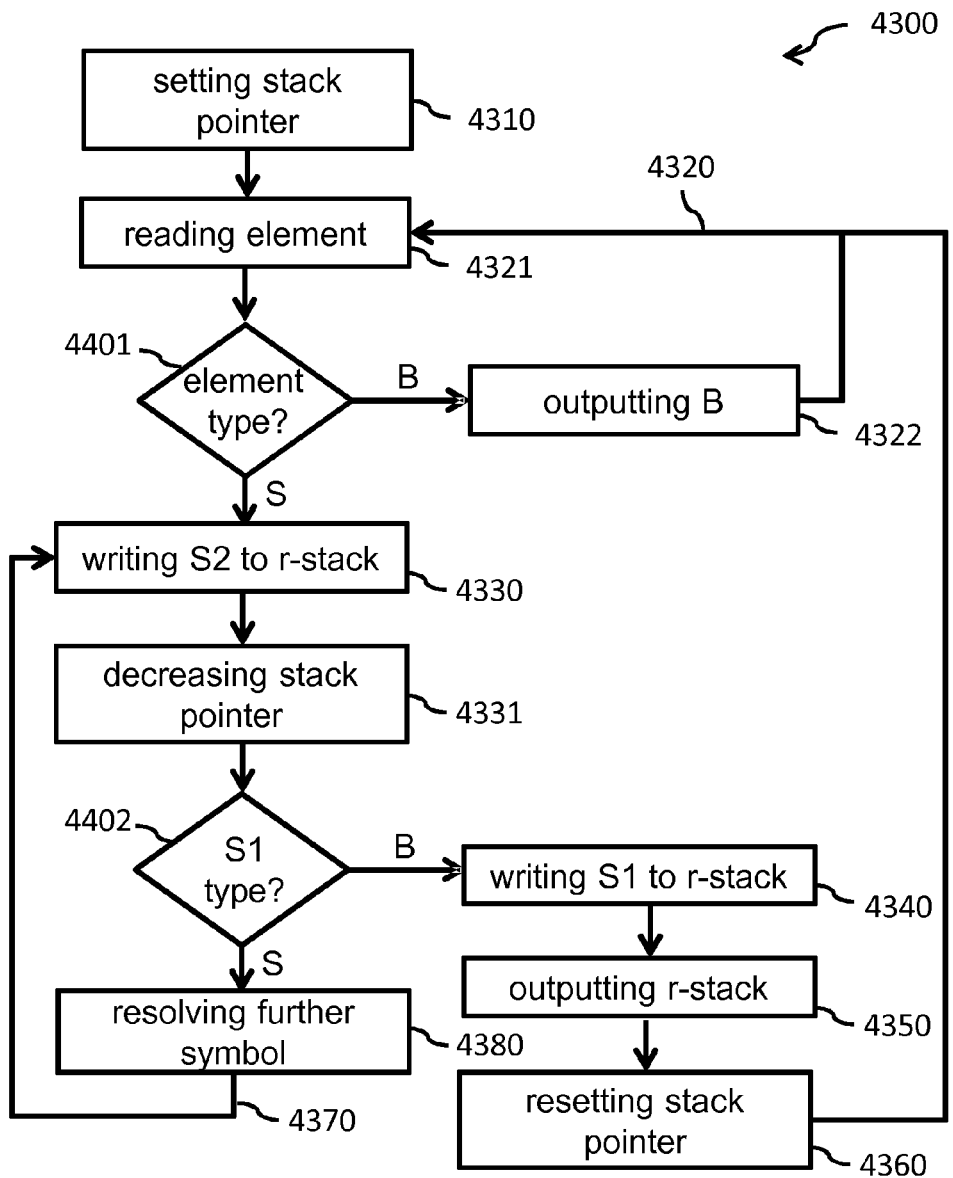
FIG. 4 is a flow chart of the generating step of the computer implemented method according to an embodiment of the invention.

FIG. 2 is a high level flow chart of a computer implemented method 4000 according to an embodiment of the invention. FIG. 2 will be described together with FIG. 4 which illustrates details of the generating step 4300 of FIG. 2. The method 4000 will be described by way of example. However, it is not intended that the example is limiting the scope of the invention in any way. The person skilled in the art will be able to transfer the teachings of the example to any other LZW based decompression extension or variant and will be able to apply the teachings to any appropriate data format.

The compressed encoded data set "L Z W 102h 7 8 105h 7 102h" is stored at a location which can be accessed 4100 by the decoding system 400. The system can then read 4200 the encoded data set and hold a respective copy in memory for further processing. The generating 4300 decompressed data set step will now be discussed in detail with reference to FIG. 4.

Table 2 shows an example, where a LZW decompression algorithm is applied to the compressed data set 310 "L Z W 102h 7 8 105h 7 102h" of the above encoding example. That is, the result of the decompression should be the uncompressed data set including the original byte character sequence "L Z W L Z 7 8 L Z 7 7 L Z". Table 2 shows step by step how the encoded compressed data set is processed by the decompression algorithm. The algorithm may start with setting a stack pointer to the reverse order stack address pointing to the end (cf. FIG. 6, rsam) of the reverse order stack (also referred to as r-stack in figures and tables). In any case, the setting of the stack pointer needs to be done before the algorithm processes any symbol of the compressed data set.

The method then loops 4320 over the compressed data set. In other words, the algorithm implemented by the method processes the compressed data set element by element. For element of the compressed data set a first check 4401 is performed with regards to the type of the respective element. The element can have a byte character type B or a symbol type S. If the element has a B type it corresponds to a raw data byte character and can be directly sent 4322 to the output. This is the case for the first element "L" and also for the second and third elements "Z" and "W".

TABLE 2

LZW decompression

| current element | previous element | dictionary symbol | content value | full (content) value | output |
|---|---|---|---|---|---|
| L |   |   |   |   | L |
| Z | L | 102h | LZ |   | Z |
| W | Z | 103h | ZW |   | W |
| 102h | W | 104h | WL |   | LZ |
| 7 | 102h | 105h | 102h + 7 | LZ7 | 7 |
| 8 | 7 | 106h | 78 |   | 8 |
| 105h | 8 | 107h | 8L |   | LZ7 |
| 7 | 105h | 108h | 105h + 7 | LZ77 | 7 |
| 102h | 7 | 109h | 7L |   | LZ |
| END |   |   |   |   |   |

With the second element "Z" the system starts to generate symbols by combining the previous element with the current element. The exact rules for creating the symbols are not explained in detail because the mechanism is well known to the person skilled in the art. In the example, the symbols are represented by Hex codes. However, other representations can be selected. For the current elements "Z" and "W" the respective symbols "102h" ("L Z") and "103h" ("Z W") are created and stored in the dictionary 430 (cf. FIG. 1) of the decoding system 400. In some embodiments the dictionary may also store representations of the full value of symbols which contain a further symbol.

If the first check 4401 determines that the current element has an S type and, therefore, is a symbol, the second portion S2 of the symbol is written 4330 to the current reverse order stack address, and the stack pointer is decreased 4331.

In the example of table 2, the forth element is the symbol "102h" that is already available in the dictionary. S1 of the symbol includes "L" and S2 of the symbol includes "Z". Therefore, in step 4330 "Z" is written to the current reverse order stack address rsam-1 (cf., FIG. 6). The stack pointer is then decreased to the reverse order stack address.

Then, in the case of the current element being a symbol, a second check 4402 is performed. The system determines the type of the first portion S1 of the current symbol, which can be a byte character type B or a symbol type S. For symbol "102h" the first portion S1 has a B type. Therefore, the first portion S1 is written 4340 to the reverse order stack and the resolution of symbol "102h" is therewith completed. The content of the reverse order stack can directly be used for the output 4340 because it already provides the correct order of byte characters "L Z". The stack pointer is reset 4360 to the last address rsam of the reverse order stack to be ready for the next symbol element.

Continuing 4320 with the next (fifth, sixth) elements leads to the first check 4401 identifying B types of the element "7" and "8" which, therefore, can be directly output 4322. When processing the fifth element a new symbol "105h" is stored in the dictionary, which is a nested symbol because the first portion S1 is the further symbol 102h. Optionally, the dictionary may also store a representation of the full value "L Z 7" of symbol "105h" in the dictionary.

Continuing 4320 with the seventh element symbol "105h", the first check 4401 determines an S type of the current element. This leads to writing 4330 the second portion S2 of symbol "105h", that is, the byte character "7", to the reverse order stack. Further, the stack pointer is decreased to the reverse order stack address rsam-1. The basic symbol translation for symbol "105h" with reversed stack is illustrated in detail in table 3.

TABLE 3

| symbol | define | value into stack | stack pointer address | string in r-stack |
|---|---|---|---|---|
| 105h | 102h + 7 | 7 | rsam | 7 |
| 102h | LZ | Z | rsam-1 | Z7 |
| L | | L | rsam-2 | LZ7 |

For symbol "105h" the second check 4402 reveals that the first portion S1 of the symbol is the further symbol "102h". Therefore, in this case a recursive resolution 4370 of the "symbol "105h" is performed by resolving 4380 the further symbol "102h". For this purpose, the further symbol is processed in the same way as if it had been an element of the compressed data set and the first check would have resulted in an S type classification of the element. In other words, the algorithm goes back to step 4330 and applies this step now to the further symbol "102h". That is, the second portion S2 of the further symbol "102h", i.e. byte character "Z", is written to the reverse order stack and the stack pointer is decreased to the address rsam-2. The second check 4402 now determines a B type for the first portion S1 of the further symbol "102h" and therefore continues with the steps 4340 to 4360 resulting in the reverse order stack content "L Z 7" as output. In case the first portion of the further symbol would have been a still further symbol the recursive resolution 4370 would go on until the last symbol in the nested symbol structure would have a byte character in the first portion S1. This is the exit condition for the recursive resolution and the method continues with the next element of the compressed data set.

The last two elements "7" and symbol "102h" of the compressed data set are processed accordingly. In the end the execution of method 4000 by the decoder using the reverse order stack results in the decoded uncompressed data set "L Z W L Z 7 8 L Z 7 7 L Z".

The recursive resolution of symbols by using a reverse order stack as illustrated in table 3 can significantly improve the performance of the decoding system.

Figure 5:
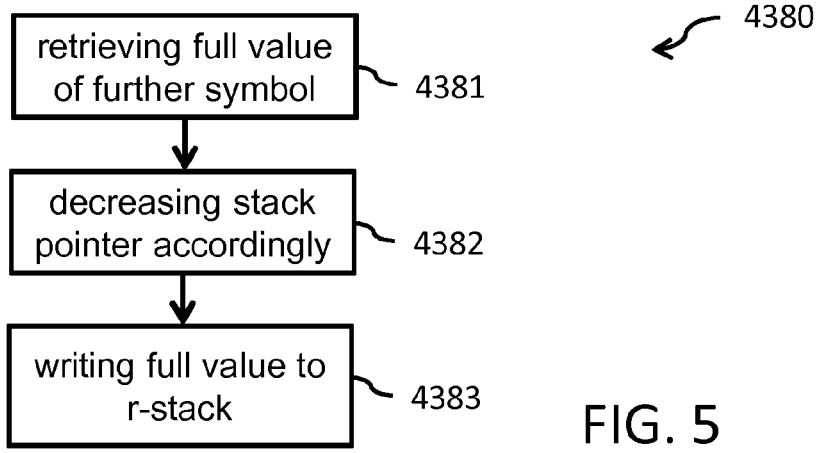
FIG. 5 is a flow chart of the resolving step of the computer implemented method according to an embodiment of the invention.

FIG. 5 is a flow chart illustrating a further embodiment of the computer implemented method 4000 for the resolution of the further symbol 4380. In this embodiment a version of the dictionary is used where for nested symbols a representation of the full value of the respective symbol is stored in the dictionary. In one embodiment the representation can be the full value itself. In one embodiment, the representation of the full value can be a full value pointer 431 to the respective address in the decompressed data set 320 (cf., FIG. 1). This address corresponds to the address of the first byte of the decoded symbol in the decompressed data set. Together with the full value pointer the length 432 of decompressed data bytes represented by the respective symbol is stored in the dictionary for the respective symbol. In other words and referring to the example of table 2, when the decoder creates the symbol 105h, a full value pointer pointing to the corresponding "L" byte character in the decompressed data set is stored in the dictionary together with the information that the length of symbol 105h is three byte characters. When the decoder arrives at the current element "105h" it does not need to perform a recursive resolution of the symbol but can rather check the respective full value pointer address and the length of the full value and retrieve the full value "L Z 7" of symbol 105h directly from the decompressed data set. Storing the representation instead of the full value of the symbol reduces memory usage of the system and improves the system performance when, for example, memory copy operations are performed. In these embodiments the resolution 4380 of a nested symbol is accelerated.

Table 4 and table 5 illustrated examples for the translation (resolutions) of the nested symbols "105h" and "108h". We assume that the second portion S2 of the symbol has already been written to the reverse order stack and the stack pointer was decreased accordingly. When the second check 4402 (cf. FIG. 4) determines an S type for the first portion S1 of the current symbol the decoder can access the dictionary and retrieve 4381 the full value of the further symbol included in S1. In table 4 the symbol "105h" includes the further symbol "102h" for which a representation of the full value "L Z" is stored in the dictionary. That is, the length of the full value is two byte characters. Therefore, the stack pointer is decreased 4382 to point to the reverse order stack address rsam-2 (cf. FIG. 6). Now the decoder can write 4383 the full value of the further symbol to the reverse order stack and the corresponding string in the stack is in the correct order for the output.

TABLE 4 accelerated symbol translation/resolution with
reverse order stack and full dictionary values - example 1

| symbol | define | value into stack | stack pointer address | string in stack |
|--------|--------|------------------|----------------------|-----------------|
| 105h   | 102h + 7 | 7              | rsam                 | 7               |
| 102h   | LZ     | LZ               | rsam-2               | LZ7             |

TABLE 5 accelerated symbol translation/resolution with
reverse order stack and full dictionary values - example 2

| symbol | define | value into stack | stack pointer address | string in stack |
|--------|--------|------------------|----------------------|-----------------|
| 108h   | 105h + 7 | 7              | rsam                 | 7               |
| 105h   | LZ7    | LZ7              | rsam-3               | LZ77            |

Table 5 shows the accelerated resolution for the multi-stage nested symbol "108h". Instead of performing a multi-step recursive resolution for the symbols "105h" and then "102h" the decoder immediately retrieves the representation of the full value of symbol "105h" from the dictionary and decreases the stack counter accordingly to the address rsam-3 because the full value has a length of three byte characters. The full value "L Z 7" is then written to the r-stack.

This optional feature further improves the decoder performance for compressed data sets. Especially in cases where many multi-stage nested symbol (symbols including a further symbol in S1 which again includes a further symbol in S1, and so on) are included in the compressed data set this can result in significant performance improvement. For example, in the case of compressed TIFF image files the performance gain achieved in test cases was 85% compared to the prior art push-down stack approach.

FIG. 6 illustrates the difference between a standard push-down stack on the left hand of the figures and the reverse order stack according to an embodiment of the invention on the right hand of the figure. The description of the previous figures continuously referred to FIG. 6 already. Therefore, only a short summary of the figure is given here. On the left hand a prior art push-down stack (LIFO) 640 is used to buffer the decoder output for the original input string "L Z W". In the example, the stack has a length of m bytes. The necessary length of the stack can be calculated by using a predefined maximum code size. For example, if the allowed maximum code size x equals 12 bits, then the maximum possible length is 2^12-258 bytes. The last usable code is fffh. Assuming fffh=ffeh+x, ffeh=ffdh+x, and so on, the last symbol is 103h=102h+x. In this most extreme case, the required stack size is fffh-102h=efdh=3837 bytes. For avoiding a memory overrun one may use 3838 bytes instead.

The first memory address is sa1 and the last memory address is sam. Respective stack address pointers are illustrated by arrows. The decoder provides the sequence "W" "Z" "L" to the stack. Therefore, the first byte written to sa1 is "W". Then the stack pointer is increased. The next byte "Z" is written to sa2 and the stack pointer is increased. The last byte "L" of the decoder sequence is written to sa3. After the stack has been filled with all byte characters for the resolved symbol, the full stack content is output leading to the reversed string "W Z L" which needs to be further processed (transformed) to get the correct order of characters.

On the right hand of the figure the reverse order stack 140 is used instead. The stack pointer is initially set to the end of the r-stack (memory address rsam). The first byte "W" is now written to this address. The stack pointer is then decreased to the memory address rsam-1 and the next byte "Z" is written to this address. Again the stack pointer is decreased to rsam-2 and the final byte "L" is written to this address. The content of the stack buffer is now output already in the correct order "L Z W".

Method steps of the invention can be performed by one or more programmable processors executing a computer program to perform functions of the invention by operating on input data and generating output. Method steps can also be performed by, and apparatus of the invention can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computing device. Generally, a processor will receive instructions and data from a read-only memory or a random access memory or both. The essential elements of a computer are at least one processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Such storage devices may also provisioned on demand and be accessible through the Internet (Cloud Computing). Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

To provide for interaction with a user, the invention can be implemented on a computer having a display device, e.g., a cathode ray tube (CRT) or liquid crystal display (LCD) monitor, for displaying information to the user and an input device such as a keyboard, touchscreen or touchpad, a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The invention can be implemented in a computing system that includes a back-end component, e.g., as a data server, or that includes a middleware component, e.g., an server, or that includes a front-end component, e.g., a client computer having a graphical user interface or a Web browser through which a user can interact with an implementation of the invention, or any combination of such back-end, middleware, or front-end components. Client computers can also be mobile devices, such as smartphones, tablet PCs or any other handheld computing device. The components of the system can be interconnected by any form or medium of digital data communication, e.g., a communication network. Examples of communication networks include a local area network (LAN) and a wide area network (WAN), e.g., the Internet or wireless LAN or telecommunication networks.

The computing system can include clients and servers. A client and server are generally remote from each other and typically interact through a communication network. The relationship of client and server arises by virtue of computer programs running on the respective computers and having a client-server relationship to each other.

The invention claimed is:

1. A computer implemented method for decompressing compressed data, comprising:
   accessing a compressed data set encoded with a LZW based compression algorithm wherein the compressed data set includes a sequence of elements including byte characters and symbols, each symbol corresponding to an encoded subset of the data set, and each symbol having a first portion including a previously defined symbol or a byte character and having a second portion including a byte character;
   reading the encoded data set;
   generating a decompressed data set by applying a LZW based decompression algorithm to the compressed data set; and
   wherein the generating step uses a reverse order stack for intermediate storage of byte characters decoded from the compressed data set.

2. The computer implemented method of claim 1, wherein the generating step further comprises:
   setting a stack pointer to a reverse order stack address pointing to the end of the reverse order stack;
   looping over the compressed data set, for each element of the compressed data set:
   if the element is a symbol,
      writing the second portion of the symbol to the current reverse order stack address, and decreasing the stack pointer;
      if the first portion of the symbol is a byte character,
         writing the first portion to the current reverse order stack address,
         outputting the reverse order stack content, resetting the stack pointer and going to the next element;
      if the first portion of the symbol is a further symbol, recursively resolving the symbol by
         resolving the further symbol by applying the symbol related steps to the further symbol until the first portion of the further symbol is a byte character.

3. The computer implemented method of claim 2, wherein the recursive resolution of the symbol further comprises:
   retrieving a representation of a full value of the further symbol from a dictionary;
   decreasing the stack pointer according to the number of bytes included in the full value; and
   writing the full value to the current reverse order stack address.

4. The computer implemented method of claim 3, wherein the representation of the full value of the further symbol is stored in the dictionary as a combination of a full value pointer and the length of decompressed data bytes represented by the further symbol, the full value pointer pointing to the address of the first decompressed data byte of the further symbol in the decompressed data set.

5. The computer implemented method of claim 1, wherein the compressed data set has any format selected from the group consisting of Printable Document Format, UNIX file format, Graphics Interchange Format, and Tagged Image File Format.

6. A computer program product that when loaded into a memory of a computing device and executed by at least one processor of the computing device executes the steps of the computer implemented method according to claim 1.

7. A computer system for decompressing compressed data, comprising:
   an interface component configured to access and read a compressed data set encoded with a LZW based compression algorithm wherein the compressed data set includes a sequence of elements including byte characters and symbols, each symbol corresponding to an encoded subset of the data set, and each symbol having a first portion including a previous symbol or a byte character and having a second portion including a byte character;
   a decoder configured to generate a decompressed data set by applying a LZW based decompression algorithm to the compressed data set; and
   a reverse order stack configured for intermediate storage of byte characters decoded by the decoder from the compressed data set.

8. The computer system of claim 7, wherein the decoder is further configured to:
   set a stack pointer to a reverse order stack address pointing to the end of the reverse order stack;
   loop over the compressed data set, for each element of the compressed data set:
   if the element is a symbol,
      write the second portion of the symbol to the current reverse order stack address, and decrease the stack pointer;
      if the first portion of the symbol is a byte character,
         write the first portion to the current reverse order stack address, output the reverse order stack content, reset the stack pointer and go to the next element;
      if the first portion of the symbol is a further symbol, recursively resolve the symbol by
         resolving the further symbol by applying the symbol related steps to the further symbol until the first portion of the further symbol is a byte character.

9. The computer system of claim 7, and further comprising:
   a dictionary configured to store full values of the symbols, wherein the decoder is further configured to:
   retrieve a representation of a full value of the further symbol from the dictionary;
   decrease the stack pointer according to the number of bytes included in the full value; and
   write the full value to the current reverse order stack address.

10. The computer system of claim 9, wherein the representation of the full value of the further symbol is stored in the dictionary as a combination of a full value pointer and the length of decompressed data bytes represented by the further symbol, the full value pointer pointing to the address of the first decompressed data byte of the further symbol in the decompressed data set.

11. The computer system of claim 7 wherein the symbols are represented through hex values.

* * * * *